United States Patent

Ozawa

Patent Number: 5,498,888
Date of Patent: Mar. 12, 1996

[54] SEMICONDUCTOR DEVICE AND METHOD FOR PROCESSING MULTIPLE INPUT SIGNALS

[75] Inventor: Takanori Ozawa, Kyogo, Japan

[73] Assignee: Rohm Co., Ltd., Kyoto, Japan

[21] Appl. No.: 212,719

[22] Filed: Mar. 14, 1994

[30] Foreign Application Priority Data

Mar. 19, 1993 [JP] Japan ................................. 5-060625

[51] Int. Cl.$^6$ ................................................. H01L 29/76
[52] U.S. Cl. ........................ 257/295; 257/324; 365/145
[58] Field of Search ................................. 257/295, 319, 257/316, 324; 365/145

[56] References Cited

U.S. PATENT DOCUMENTS

| | | | |
|---|---|---|---|
| 3,832,700 | 8/1974 | Wu et al. | |
| 5,079,603 | 1/1992 | Komori et al. | 257/316 |
| 5,309,392 | 5/1994 | Ootsuka et al. | 365/145 |

FOREIGN PATENT DOCUMENTS

| | | | |
|---|---|---|---|
| 54-40043 | 3/1979 | Japan | 257/319 |
| 59-175770 | 10/1984 | Japan | 257/319 |
| 3-06679 | 1/1991 | Japan | 257/319 |
| 5-235370 | 9/1993 | Japan | 257/295 |

OTHER PUBLICATIONS

Yamauchi, "A Metal–Insulator–Semiconductor (MIS) Device Using a Ferroelectric Polymer Thin Film in the Gate Insulator," Japanese Journal of Applied Physics, vol. 25 No. 4, Apr. 1986, pp. 590–594.

Primary Examiner—Sara W. Crane
Assistant Examiner—Courtney A. Bowers
Attorney, Agent, or Firm—Steven M. Rabin

[57] ABSTRACT

A semiconductor device having a source region, a drain region, a channel region between the source region and the drain region, a gate consisting of at least three input electrodes provided above the channel region, and a potential modulating film provided between the channel region and the gate. The potential modulating film can assume at least two potential modulating states, so that the potential of the channel region is modulated between and held at different values. The potential of the channel region is modulated by changing the state of the potential modulating film. Specifically, the potential of the channel region is modulated by not only applying voltages to the input electrodes but also controlling the state of the potential modulating film. If in processing at least three input signals, a predetermined one of them corresponds to control of the state of the potential modulating film and the remaining input signals correspond to the input voltages to the input electrodes, the number of wires can be decreased.

12 Claims, 7 Drawing Sheets

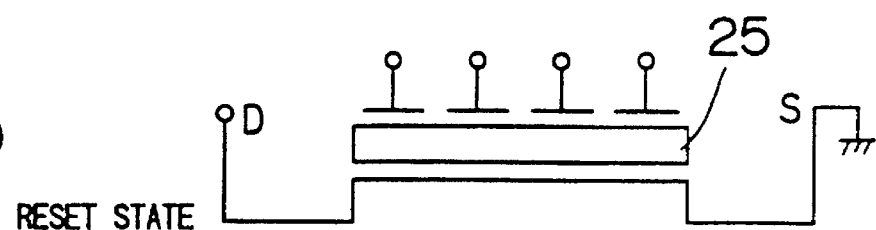
FIG. 2(a) RESET STATE
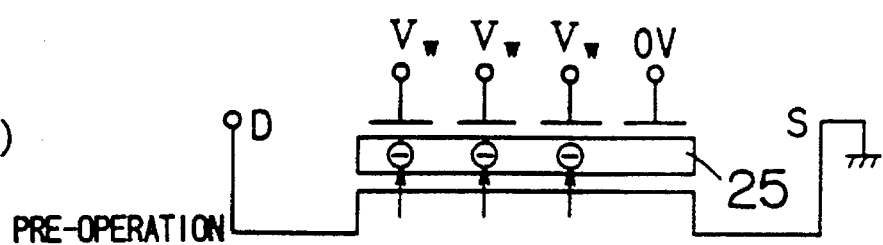
FIG. 2(b) PRE-OPERATION
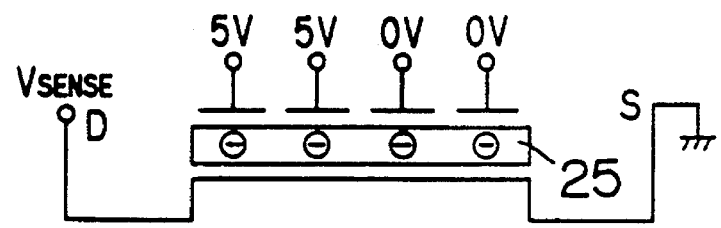
FIG. 2(c)
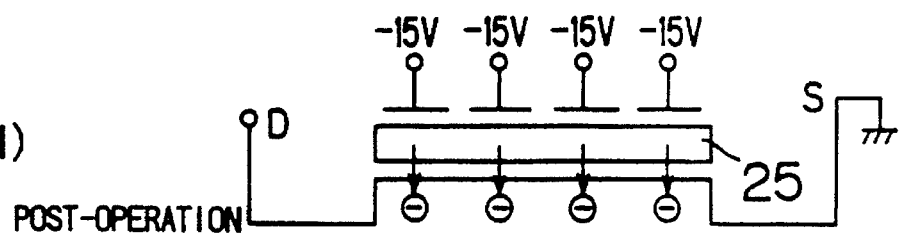
FIG. 2(d) POST-OPERATION

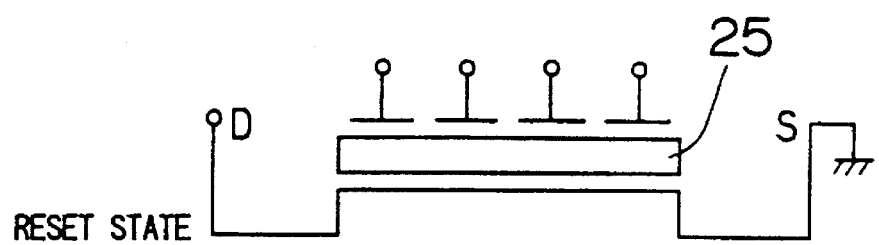
FIG. 4(a) RESET STATE
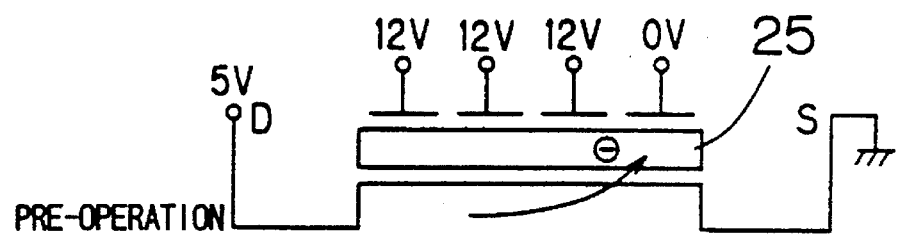
FIG. 4(b) PRE-OPERATION
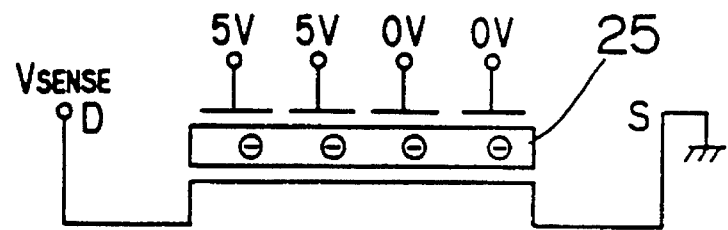
FIG. 4(c)
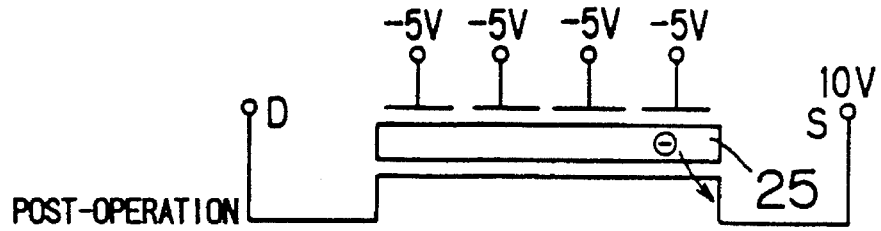
FIG. 4(d) POST-OPERATION

SEMICONDUCTOR DEVICE AND METHOD FOR PROCESSING MULTIPLE INPUT SIGNALS

BACKGROUND OF THE INVENTION

1. Field of the Invention

The present invention relates to a semiconductor device in which a gate is constituted by a plurality of input electrodes, for example, a Neuro transistor of a floating gate type, and a method of operating the semiconductor device.

2. Description of the Related Art

A Neuro device is a device in which a function equivalent to a nerve cell (neuron) constituting the brain, the eyes and the like of a human being is realized by an electric circuit. Specifically, a Neuro device weights a plurality of input signals, respectively, and outputs a predetermined signal when the result of addition of the weighted signals reaches a predetermined value. Such a Neuro device comprises weighting means for weighting the plurality of input signals and a Neuro transistor in which conduction between a source and a drain occurs when the sum of input voltages to a gate constituted by a plurality of input electrodes reaches a predetermined value. The weighting means corresponds to synapses of the nerve cell, which is constituted by, for example, a resistor and a field effect transistor. The Neuro transistor corresponds to the cell body of the nerve cell.

One example of the construction of the Neuro transistor is shown in FIG. 7. This Neuro transistor is referred to as one of a floating gate type. For example, a pair of $N^+$-type impurity diffusion layers 2 and 3 corresponding to a source and a drain is formed spaced apart from each other by a predetermined distance on a P-type semiconductor substrate 1. A region therebetween becomes a channel region 4. A gate oxide film 5, a floating gate 6 and an interlayer insulation film 7 are sequentially laminated on the channel region 4. A plurality of input electrodes 11, 12, 13, 14 and 15 to which weighted input signals are respectively applied are formed on the interlayer insulation film 7.

FIG. 3 is an electric circuit diagram showing an equivalent circuit in the vicinity of a gate of the above described Neuro transistor. Specifically, the Neuro transistor corresponds to a series circuit of a capacitor $C_{OX}$ and a variable capacitor $C_M$. The capacitor $C_{OX}$ is constituted by the semiconductor substrate 1, the gate oxide film 5 and the floating gate 6. On the other hand, the variable capacitor $C_M$ is constituted by the plurality of upper electrodes 11, 12, 13, 14 and 15 constituting the gate, the interlayer insulation film 7 and the floating gate 6.

For example, consider a case where a voltage of 0 volt or 5 volts is applied to the respective upper electrodes 11, 12, 13, 14 and 15. In this case, the capacity of the variable capacitor $C_M$ is changed into six types depending on the number of upper electrodes (0 to 5) to which a voltage of 5 volts is applied. Consequently, the coupling ratio of the capacitor $C_M$ to the capacitor $C_{OX}$ is changed, thereby to make it possible to modulate the potential on the surface of the channel region 4 among six values.

For example, it is assumed that the threshold value of a voltage to be applied to the upper surface of the gate oxide film 5 so as to allow conduction between the impurity diffusion regions 2 and 3 is 3 volts. In this case, when a voltage of 5 volts is applied to the upper electrode 11 and a voltage of 0 volt is applied to the remaining upper electrodes 12, 13, 14 and 15, a substantial applied voltage to the channel region 4 becomes, for example, 1 volt, so that no conduction between the impurity diffusion regions 2 and 3 occurs. On the other hand, when a voltage of 5 volts is applied to each of the upper electrodes 11, 13 and 15 and a voltage of 0 volt is applied to the remaining upper electrodes 12 and 14, a substantial applied voltage to the channel region 4 becomes, for example, 3 volts, so that conduction between the impurity diffusion regions 2 and 3 occurs.

When the sum of the applied voltages to the upper electrodes 11, 12, 13, 14 and 15 is not less than 15 volts, conduction between the impurity diffusion regions 2 and 3 occurs. That is, this transistor has the same function as the cell body of the nerve cell.

If the above described Neuro transistor is used, a five-input NAND gate, for example, can be constituted by one transistor. Consequently, if the Neuro transistor is used to construct an integrated circuit, it is possible to constitute a high-function integrated circuit by a small number of devices.

Although the above described Neuro transistor is effective for the decrease in the number of devices, however, it has a large number of wires. Therefore, if the integrated circuit is constructed using this Neuro transistor, the number of wires is significantly increased, resulting in the increased substrate area.

SUMMARY OF THE INVENTION

An object of the present invention is to provide a semiconductor device in which the number of wires can be decreased.

Another object of the present invention is to provide a method of operating a semiconductor device in which the number of wires can be decreased.

A semiconductor device to which the present invention is applied has a source region formed on a semiconductor substrate, a drain region formed on the semiconductor substrate, a channel region which is a region between the source region and the drain region on the semiconductor substrate, a gate provided above the channel region, and a potential modulating film provided between the channel region and the gate. The potential modulating film can assume at least two different states where the potential of the channel region can be modulated to different values, and can hold the respective states.

In the present invention, the state of the potential modulating film is set to any state, thereby to modulate the potential of the channel region. Specifically, the potential of the channel region is modulated by not only applying a voltage to the gate but also controlling the state of the potential modulating film. If in processing a plurality of input signals, a predetermined one of the input signals corresponds to control of the state of the potential modulating film and the remaining input signal corresponds to the input voltage to the gate, therefore, the number of electrodes can be made smaller than that in the conventional example. Consequently, the number of wires is decreased.

Furthermore, the results of processing of the plurality of input signals can be detected by determining whether or not conduction between the source region and the drain region occurs in a state where the input voltage is supplied to the gate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2(a) to (d) are diagrams for explaining a method of operating a semiconductor device according to a first embodiment of the present invention;

FIGS. 4(a) to (d) are diagrams for explaining a method of operating a semiconductor device according to a second embodiment of the present invention;

DESCRIPTION OF PREFERRED EMBODIMENTS

Figure 1:
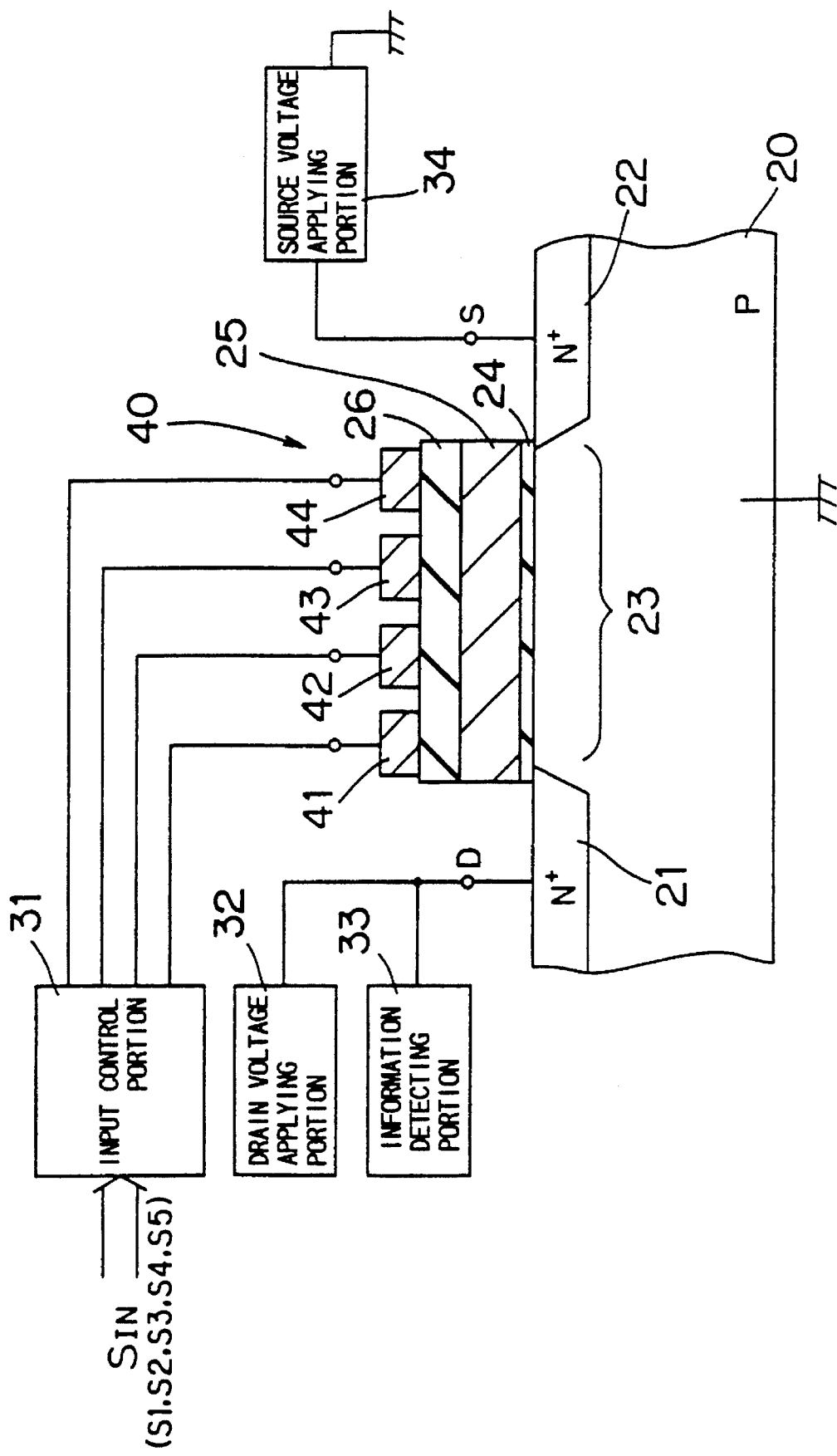
FIG. 1 is a diagram showing the concept of the construction of a Neuro transistor to which an embodiment of the present invention is applied and the construction of a peripheral circuit for operating the Neuro transistor.

FIG. 1 is a diagram showing the concept of the construction of a Neuro transistor to which an embodiment of the present invention is applied and the electrical construction for operating the Neuro transistor. The Neuro transistor comprises an N$^+$-type drain diffusion region 21 (hereinafter referred to as "a drain region 21") and an N$^+$-type source diffusion region 22 (hereinafter referred to as "a source region 22") formed by diffusing N-type impurities at high concentration in a region in the vicinity of the surface of a P-type semiconductor substrate 20. The drain region 21 and the source region 22 are formed spaced apart from each other by a predetermined distance, and a region therebetween is a channel region 23.

A tunnel oxide film 24, a floating gate 25 serving as a potential modulating film and an interlayer insulation film 26 are sequentially laminated on the channel region 23. A gate 40 is provided on the interlayer insulation film 26. This gate 40 has four input electrodes 41, 42, 42 and 44.

Voltages corresponding to first to fourth signals S1, S2, 3 and S4 in an input signal S$_{IN}$ comprising five types of signals S1, S2, S3, S4 and S5 are applied to the input electrodes 41, 42, 43 and 44 from an input control portion 31. In addition, a drain voltage applying portion 32 for applying a voltage to the drain region 21 and an information detecting portion 33 for determining whether or not conduction between the drain region 21 and the source region 22 occurs on the basis of the voltage change at a drain D are connected to the drain region 21. Furthermore, a source voltage applying portion 34 for applying a voltage to the source region 22 is connected to the source region 22.

Figure 3:
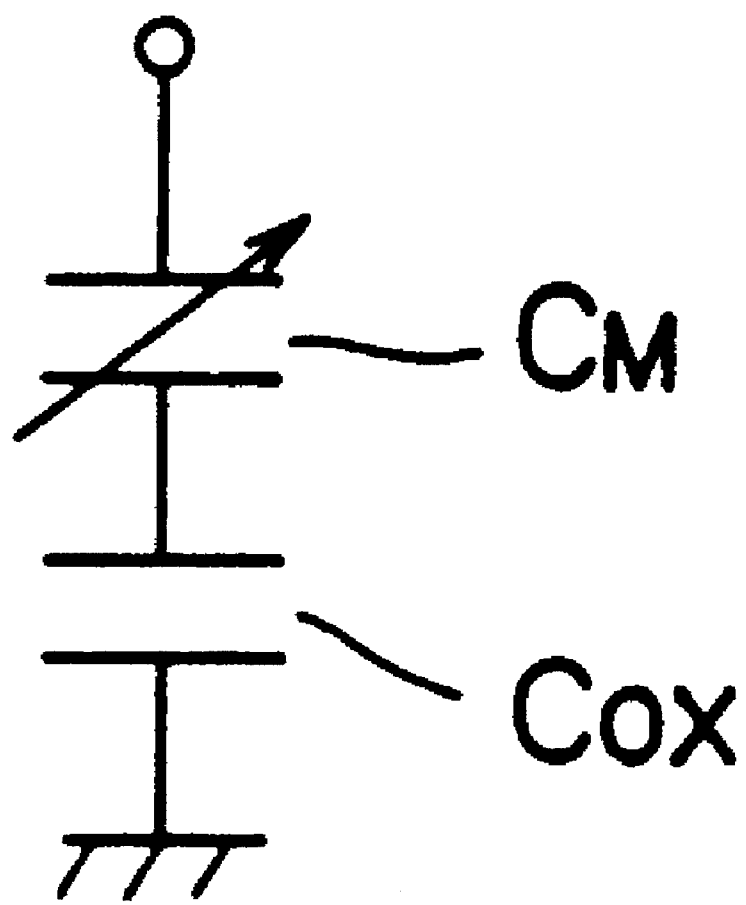
FIG. 3 is a diagram showing an equivalent circuit in the vicinity of a gate of the above described Neuro transistor.

An equivalent circuit in the vicinity of the gate 40 of the Neuro transistor becomes a circuit shown in FIG. 3. Specifically, a series circuit of a capacitor C$_{OX}$ and a variable capacitor C$_M$ is formed in the vicinity of the gate 40. The capacitor C$_{OX}$ is constituted by the semiconductor substrate 20, the tunnel oxide film 24 and the floating gate 25. The variable capacitor C$_M$ is constituted by the plurality of upper electrodes 41, 42, 43 and 44, the interlayer insulation film 26 and the floating gate 25.

Figure 7:
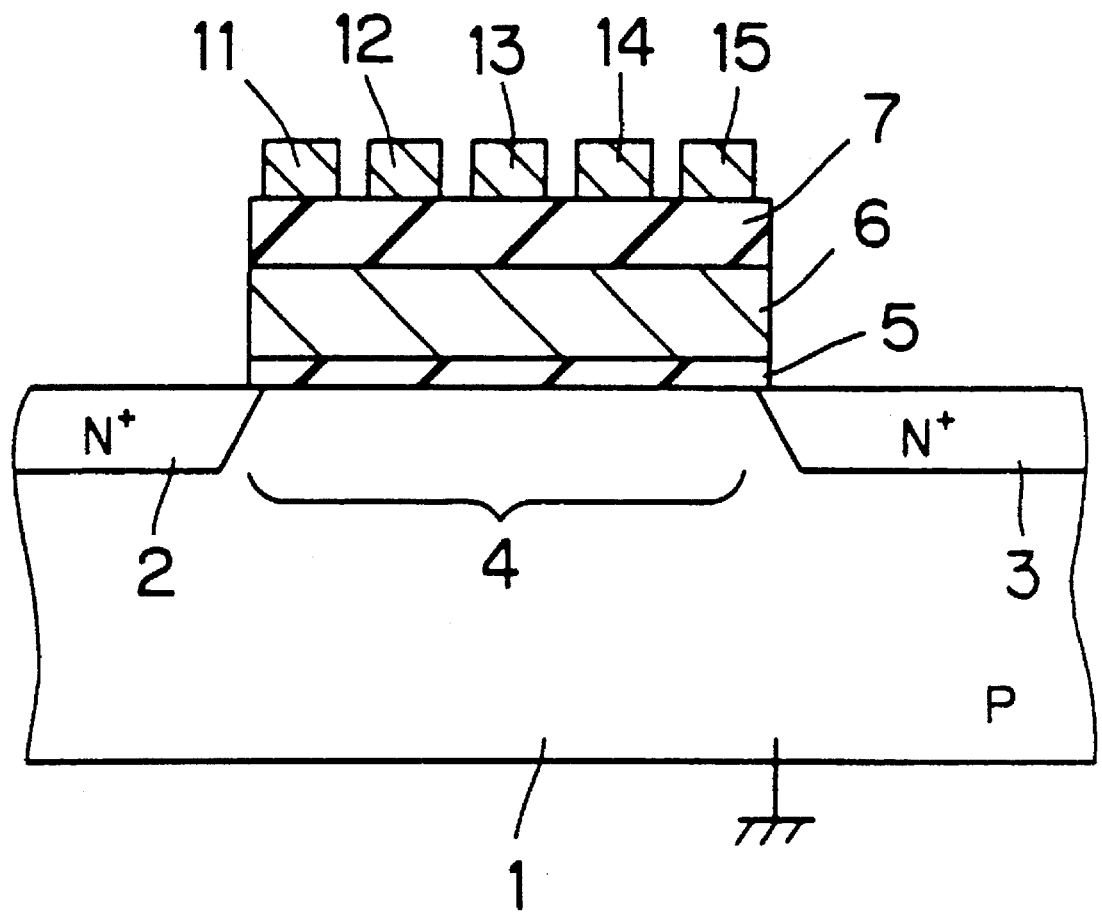
FIG. 7 is a cross sectional view showing the construction of a Neuro transistor.

In such construction, the following method is applied, thereby to achieve the same function as that of a Neuro transistor having five input electrodes shown in FIG. 7 while using the four input electrodes 41 to 44. Specifically, the charge storage state of the floating gate 25 corresponds to the fifth signal S5 in the input signal S$_{IN}$.

The detailed operation will be described below. For simplification of illustration, the input control portion 31 shall input a voltage of 0 volt or 5 volts to each input electrode. However, the input control portion 31 can also apply weighted voltages to the input electrodes 41, 42, 43 and 44, respectively, in applying voltages corresponding to the input signal S$_{IN}$ to the input electrodes 41, 42, 43 and 44.

FIGS. 2(a)–2(d) are diagrams showing the concept for explaining an operating method according to the present embodiment in detail. In this description, consider a case where the signal S$_{IN}$ is constituted by five binary input signals S1, S2, S3, S4 and S5 which respectively assume a high level or a low level.

First, the Neuro transistor is in a reset state shown in FIG. 2(a) before the signals are inputted to the Neuro transistor.

From this state, a pre-operation for controlling the charge storage state of the floating gate 25 is performed on the basis of the signal S5 which does not correspond to the input electrodes 41 to 44. For example, electrons are injected into the floating gate 25 if the signal S5 is at a low level, while no electrons are injected if the signal S5 is at a high level. FIG. 2(b) shows the outline of an operation in a case where electrons are injected. Specifically, the input control portion 31 applies voltages of 12 to 20 volts to the input electrodes 41, 42 and 43, respectively. As a result, electrons in the semiconductor substrate 20 pass through the tunnel oxide film 24 according to FN tunneling, to be injected into the floating gate 25.

The potential of the channel region 23 can be modulated depending on the presence or absence of electrons in the floating gate 25, thereby to make it possible to control the existence or non existence of a channel in the channel region 23.

As shown in FIG. 2(c), the voltages corresponding to the input signals S1 to S4 are then applied to the input electrodes 41, 42, 43 and 44 from the input control portion 31. For example, if the input signals S1 to S3 are at a high level and the input signal S4 is at a low level, a voltage of 5 volts is applied to each of the input electrodes 41, 42 and 43 and a voltage of 0 volt is applied to the input electrode 44.

At this time, the potential of the channel region 23 is modulated depending on the total area of the lower surface of the input electrodes to which a voltage of 5 volts is applied. Specifically, the coupling ratio of the capacitors C$_{OX}$ to C$_M$ is determined by the total number of input electrodes to which a voltage of 5 volts is applied, and a voltage corresponding to this coupling ratio is applied to the upper surface of the tunnel oxide film 24. A voltage applied to the tunnel oxide film 24 is affected by the presence or absence of charge in the floating gate 25.

For example, when no electrons are stored in the floating gate 25, a voltage of 1.5×N$_{ON}$ volts shall be applied to the tunnel oxide film 24 depending on the number N$_{ON}$ of input electrodes to which a voltage of 5 volts is applied. When electrons are stored in the floating gate 25, a voltage applied to the tunnel oxide film 24 shall be decreased by 1.5 volts, to be $1.5 \times (N_{ON}-1)$ volts.

Furthermore, it is assumed that the threshold value of a voltage to be applied to a region between the upper surface of the tunnel oxide film 24 and the semiconductor substrate 20 so as to allow conduction between the source and the drain is 3 volts.

In this case, when a voltage of 5 volts is applied to the two input electrodes 41 and 42 and electrons are stored in the floating gate 25 as shown in FIG. 2(c), a voltage of 1.5 (=1.5×(2−1)) volts is applied to the upper surface of the tunnel oxide film 24. Consequently, no inversion layer is formed on the surface of the channel region 23, and no conduction between the source and the drain occurs. Specifically, if the two signals S1 and S2 are at a high level and the signals S3, S4 and S5 are at a low level, the Neuro transistor enters a disconnected state.

On the other hand, if a voltage of 5 volts is applied to the two input electrodes 41 and 42 and no electrons are stored in the floating gate 25, a voltage applied to the upper surface of the tunnel oxide film 24 is 3 (=1.5×2) volts, so that conduction between the source and the drain occurs. Specifically, when the three signals S1, S2 and S5 are at a high level and the signals S3 and S4 are at a low level, the Neuro transistor is rendered conductive.

Similarly, it can be confirmed that conduction between the source and the drain occurs when at least three of the signals S1 to S5 are at a high level, while no conduction between the source and the drain occurs otherwise.

The drain voltage applying portion 32 applies a sense voltage $V_{SENSE}$ (for example, 1 volt) to the drain D through a resistor R1 in a state where voltages corresponding to the input signals S1 to S4 are applied to the input electrodes 41 to 44. The source voltage applying portion 34 applies a ground potential to the source S. At this time, the information detecting portion 33 determines whether or not the potential at the drain D is lowered. That is, the potential at the drain D is held at the sense voltage $V_{SENSE}$ if no conduction between the source and the drain occurs, while being lowered to the ground potential if conduction between the source and the drain occurs. If the presence or absence of the potential drop at the drain D is examined, it can be known whether or not conduction between the source and the drain occurs.

In the above described manner, the information detecting portion 33 detects a signal at a low level (the ground potential) when at least three of the signals S1 to S5 are at a high level, while detecting a signal at a high level (the sense voltage $V_{SENSE}$) in the other cases. This signal corresponds to an output of the Neuro transistor.

When processing of the other input signals S1 to S5 is subsequently performed, a post-operation shown in FIG. 2(d) is performed. Specifically, the input control portion 31 applies a voltage of −15 volts to each of the upper electrodes 41, 42, 43 and 44. Consequently, electrons in the floating gate 25 are extracted to the semiconductor substrate 20 by FN tunneling. Consequently, the Neuro transistor is returned to the reset state shown in FIG. 2(a).

It is preferable that a signal which is not variable over a processing cycle for processing the signal $S_{IN}$ and a signal which is changed on the basis of a lowest-speed clock are assigned to the signal S5. In this case, if the high levels/low levels of the signals S1 to S4 are changed in synchronism with a high-speed clock, the signals which are changable in synchronism with the clock appears at the drain D of the Neuro transistor.

As described in the foregoing, according to the present embodiment, processing of the five input signals S1 to S5 can be performed using the Neuro transistor having the four input electrodes 41, 42, 43 and 44. Consequently, the number of wires is reduced, thereby to make it possible to significantly reduce the substrate area if an integrated circuit is constructed using the Neuro transistor.

The post-operation shown in FIG. 2(d) may be performed as a reset operation prior to performing processing of the input signals.

Furthermore, the post-operation may be omitted. In this case, information corresponding to the signal S5 is stored in a nonvolatile manner as the charge storage state of the floating gate 25 even after the power is shut off. Therefore, information which requires a backup corresponds to the signal S5, thereby to make it possible to add a backup function to a Neuro device. When information of a plurality of bits must be held, a plurality of Neuro transistors are used in parallel and respective one inputs (inputs corresponding to the signal S5) of the plurality of Neuro transistors are used for the backup.

FIGS. 4(a) to 4(d) are diagrams for explaining an operating method according to a second embodiment of the present invention. In the present embodiment, FIG. 1 will be referred to again. A reset state shown in FIG. 4(a) proceeds to a pre-operation shown in FIG. 4(b). In the pre-operation, an input control portion 31 applies a high voltage of 12 volts to input electrodes 41, 42 and 43, a drain voltage applying portion 32 applies a voltage of 5 volts to a drain D, and a source voltage applying portion 34 applies a ground potential to a source S. Consequently, in a channel region 23, a channel from a drain region 21 to the vicinity of a source region 22 is formed. Therefore, in the channel region 23, a strong electric field is applied to the vicinity of the source region 22, so that hot electrons are generated in this region. The hot electrons are induced by a high voltage applied to upper electrodes 41, 42 and 43, to be injected into a floating gate 25 through a tunnel oxide film 24.

Thereafter, as shown in FIG. 4(c), voltages corresponding to input signals S1 to S4 are applied to the input electrodes 41 to 44, the drain voltage applying portion 32 applies a sense voltage $V_{SENSE}$ to the drain D, and an information detecting portion 33 detects an output of the Neuro transistor.

In order to perform processing of another signal, a post-operation shown in FIG. 4(d) is performed. In the present embodiment, the input control portion 31 applies a negative voltage of −5 volts to the input electrodes 41 to 44, and the source voltage applying portion 34 applies a high voltage of 10 volts to the source S. Consequently, electrons in the floating gate 25 are extracted to the source region 22 according to FN tunneling.

Therefore, the present embodiment is the same as the above described first embodiment except that electrons are injected into the floating gate 25 by injecting hot electrons, while being extracted from the floating gate 25 according to FM tunneling. Consequently, also in the present embodiment, the same function and effect as those in the above described first embodiment are obtained.

The post-operation shown in FIG. 4(d) may be performed as a reset operation before starting arbitrary processing, and the post-operation may be omitted, as in the above described first embodiment.

Figure 5A:
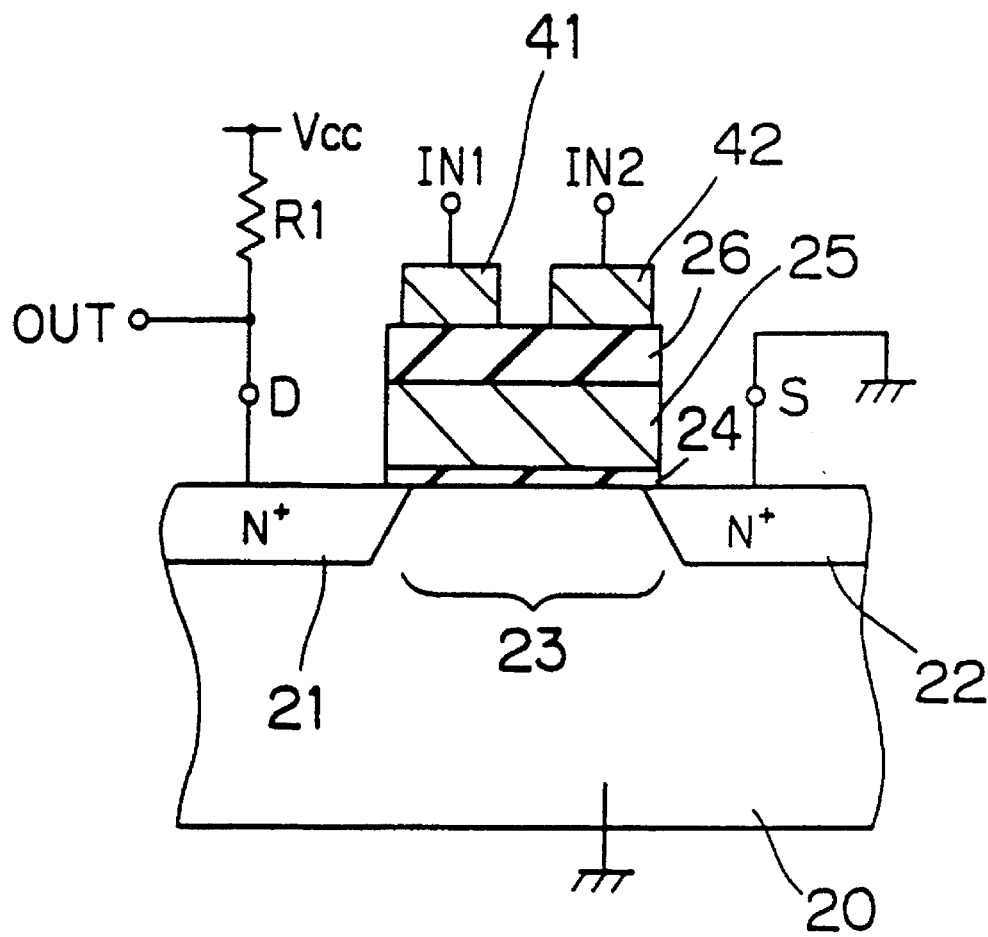
FIG. 5A is a cross sectional view showing the construction of a Neuro transistor for constituting a three-input NAND gate which is an application of the first embodiment and the second embodiment.
Figure 5B:
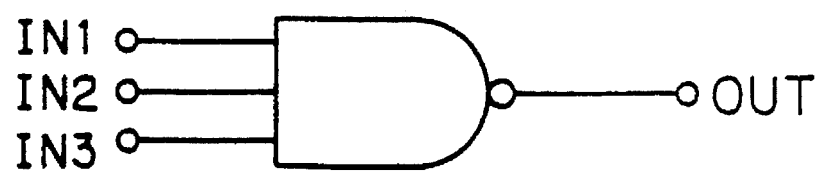
FIG. 5B is a block diagram showing the three-input NAND gate.

FIGS. 5A and 5B are diagrams showing an application of the above described first embodiment or second embodiment in which a three-input NAND gate is constructed. A Neuro transistor has two input electrodes 41 and 42, as shown in FIG. 5A. In FIG. 5A, the same reference numerals are assigned to portions corresponding to the respective portions shown in FIG. 1. The operating method according to the above described first or second embodiment is applied to the Neuro transistor, thereby to construct a three-input NAND gate shown in FIG. 5B.

Out of three input signals of the three-input NAND gate, a voltage corresponding to an input signal IN1 is applied to the input electrode 41, a voltage corresponding to an input signal IN2 is applied to the input electrode 42, and an input signal IN3 corresponds to the presence or absence of charge stored in a floating gate 25.

An operation for obtaining an output signal OUT corresponding to the input signals IN1, IN2 and IN3 is roughly divided into two stages. An operation in the first stage is a pre-operation for controlling the charge storage state of the floating gate 25 depending on whether the input signal IN3 is at a high level or a low level. That is, if the input signal IN3 is at a high level, no electrons are injected into the floating gate 25. On the other hand, if the input signal IN3 is at a low level, electrons are injected into the floating gate 25. If electrons are injected according to FN tunneling (corresponding to the method according to the first embodiment), a voltage of 15 volts is applied to the electrode 41 and a voltage of 0 volt is applied to the electrode 42.

After the charge storage state of the floating gate 25 is controlled, the operation in the first stage proceeds to an operation in the second stage. That is, voltages corresponding to the input signals IN1 and IN2 are respectively applied to the input electrodes 41 and 42. For example, a voltage of 5 volts is applied to the input electrode 41 if the input signal IN is at a high level, while a voltage of 0 volt is applied thereto if it is at a low level. The same is true for the electrode 42. On the other hand, a drain voltage applying portion 31 (see FIG. 1) supplies a voltage Vcc (for example, 5 volts) to a drain D through a resistor R1. The source S is brought into a ground potential. In this state, a voltage at the drain D is detected as the output signal OUT.

For example, it is assumed that, in a state where no electrons are injected into the floating gate 25, a voltage applied to the upper surface of a tunnel oxide film 24 shall be $2 \times N_{ON}$ volts when the number of input electrodes 41 and 42 to which a voltage of 5 volts is applied is $N_{ON}$. In a state where electrons are injected into the floating gate 25, a voltage applied to the upper surface of the tunnel oxide film 24 shall be decreased by 2 volts, to be $2 \times (N_{ON} - 1)$ volts. In addition, the threshold value of the voltage to be applied to the upper surface of the tunnel oxide film 24 shall be 3 volts.

In this case, only when a voltage of 5 volts is applied to both the input electrodes 41 and 42 and no electrons are injected into the floating gate 25, conduction between the source and the drain occurs. Specifically, only when all the input signals IN1, IN2 and IN3 are at a high level, the output signal OUT attains a low level. Consequently, a truth table becomes the following Table 1. This is nothing but a truth table of a three-input NAND gate. In Table 1, a sign "H" denotes a high level (Vcc=5 volts), and a sign "L" denotes a low level (0 volt).

TABLE 1

| input signal | | | output signal |
|---|---|---|---|
| IN1 | IN2 | IN3 | OUT |
| H | H | H | L |
| H | H | L | H |
| H | L | H | H |
| H | L | L | H |
| L | H | H | H |
| L | H | L | H |
| L | L | H | H |
| L | L | L | H |

In the above described manner, a three-input NAND gate can be constructed using one Neuro transistor having two input electrodes.

Figure 6:
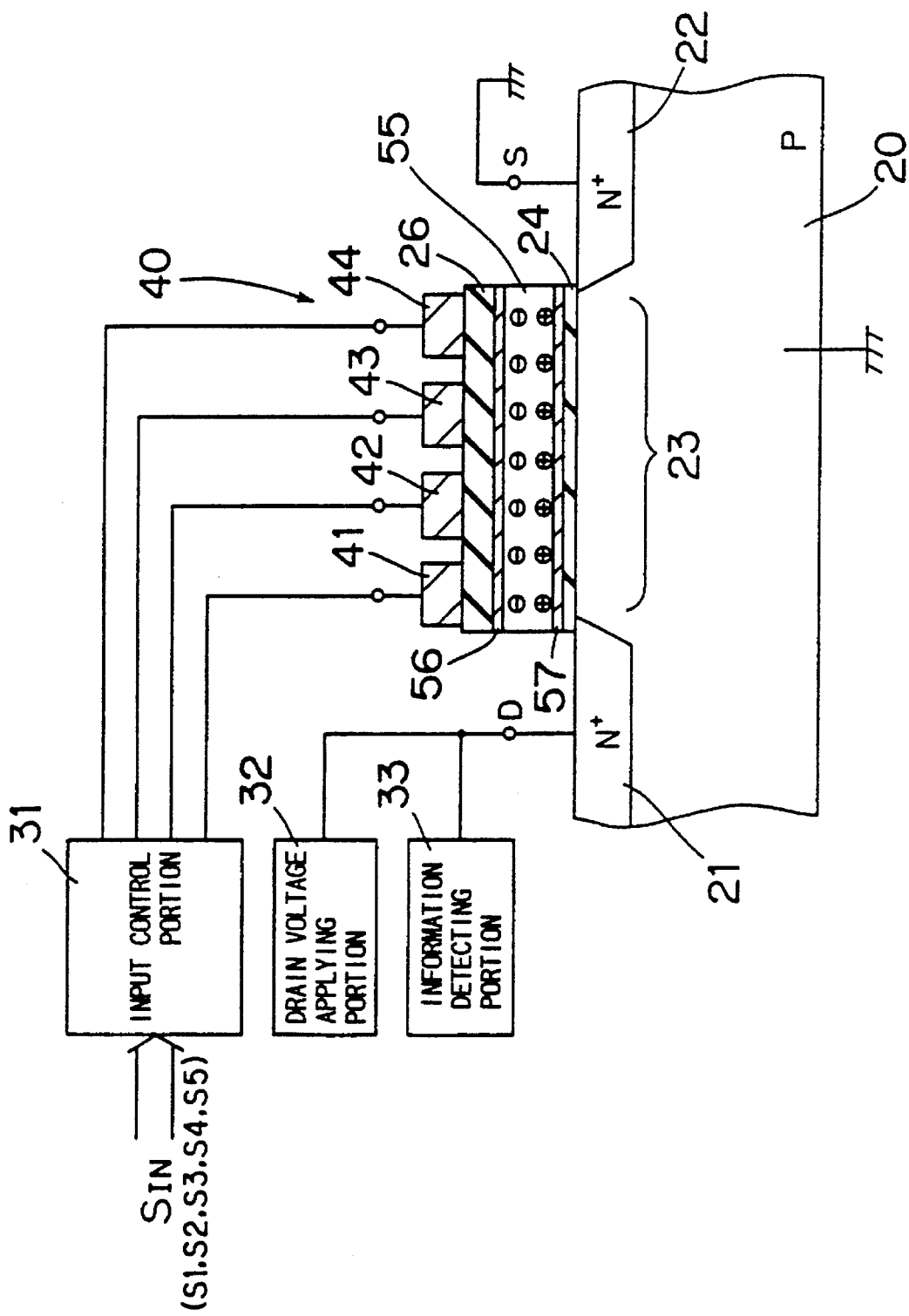
FIG. 6 is a diagram showing the concept of the construction of a Neuro transistor and the construction of a peripheral circuit to which a method of operating a semiconductor device according to a third embodiment of the present invention is applied.

FIG. 6 is a diagram showing the concept of the construction of a Neuro transistor to which an operating method according to a third embodiment of the present invention is applied and the construction of a peripheral circuit for operating the Neuro transistor. In FIG. 6, the same reference numerals are assigned to portions having the same functions as those in the above described respective portions shown in FIG. 1.

In the present embodiment, a ferroelectric material film 55 which is made of PZT (Lead Zirconate Titanate) and the like is interposed as a potential modulating film between an interlayer insulation film 26 and a tunnel oxide film 24 in place of a floating gate. Barrier metal layers 56 and 57 are respectively provided on the upper surface and the lower surface of the ferroelectric material film 55.

In the construction, the coupling ratio of two capacitors formed between input electrodes and a semiconductor substrate 20 is changed depending on the number of electrodes to which a voltage of 5 volts is applied out of the input electrodes 41, 42, 43 and 44. Consequently, the potential of a channel region 23 can be modulated depending on the number of input electrodes to which a voltage of 5 volts is applied. One of the above described two capacitors is constructed with the interlayer insulation film 26 being interposed between the input electrode and the barrier metal layer 56. The other capacitor is constructed with the tunnel oxide film 24 being interposed between the semiconductor substrate 20 and the barrier metal layer 57.

The potential of the channel region 23 is modulated also depending on a polarized state of the ferroelectric material film 55. Specifically, when the ferroelectric material film 55 is polarized in a direction from a gate 40 to the semiconductor substrate 20 as shown in FIG. 6, electrons are induced on the surface of the channel region 23. On the other hand, when the ferroelectric material film 55 is polarized in the opposite direction to the direction shown in FIG. 6, holes are induced on the surface of the channel region 23. If the ferroelectric material film is polarized as shown in FIG. 6, therefore, conduction between a source and a drain occurs even if the number of input electrodes to which a voltage of 5 volts is applied. On the other hand, if the ferroelectric material film 55 is polarized in the opposite direction to the direction shown in FIG. 6, conduction between the source and the drain does not easily occurs.

For example, when processing of input signals S1 to S5 is performed, an input control portion 31 first applies a voltage corresponding to the signal S5 to the input electrodes 41, 42, 43 and 44, to polarize the ferroelectric material film 55 in the direction shown in FIG. 6 or the opposite direction. For example, when the ferroelectric material film 55 is polarized in the direction shown in FIG. 6, a positive high voltage (for example, 15 volts) is applied to the input electrodes 41, 42, 43 and 44. On the other hand, when the ferroelectric material film 55 is polarized in the opposite direction to the direction shown in FIG. 6, a negative high voltage (for example, −15 volts) is applied to the input electrodes 41, 42, 43 and 44. The polarized state of the ferroelectric material film 55 remains even after removing applied voltages to the input electrodes 41, 42, 43 and 44 by the remaining polarization. The remaining polarization of a ferroelectric material is described in, for example, U.S. Pat. No. 3,832,700.

After the direction of polarization of the ferroelectric material film 55 corresponds to the signal S5, the input control portion 31 applies voltages (5 volts or 0 volt) corresponding to the signals S1, S2, S3 and S4 to the input electrodes 41, 42, 43 and 44, respectively. In this state, the drain voltage applying portion 32 applies a sense voltage $V_{SENSE}$ to a drain D through a resistor R1. At this time, an information detecting portion 33 detects the presence or absence of the voltage drop at the drain D.

As described in the foregoing, according to the present embodiment, the potential of the channel region 23 is controlled by controlling the direction of polarization of the ferroelectric material film 55 instead of modulating the potential of the channel region 23 depending on the presence or absence of charge in the floating gate. Consequently, it is possible to achieve the same function and effect as those in the above described first and second embodiments.

Moreover, the inversion speed of the polarization of the ferroelectric material film 55 is significantly high, that is, approximately the switching speed of a MOS transistor (for example, 10 nanoseconds to 100 nanoseconds). Therefore, a signal which is not variable over a processing cycle and a signal which is changed on the basis of a lowest-speed clock need not be assigned to the signal S5 corresponding to the polarized state of the ferroelectric material film 55. That is, a signal which is changed on the basis of a high-speed clock can correspond to the polarized state of the ferroelectric material film 55. Therefore, the degree of freedom in a case where the Neuro transistor is used is significantly improved.

Furthermore, even in the present embodiment, a NAND gate of the same construction as that shown in FIG. 5 can be constructed.

Although description was made of the embodiment of the present invention, the present invention is not limited to the above described embodiment. For example, although description was made of a case where a voltage of 0 volt or 5 volts is applied as voltages corresponding to the input signals to the input electrodes 41, 42, 43 and 44, a voltage having an arbitrary value to which a predetermined weight is added for each input electrode may be applied to the input electrodes 41, 42, 43 and 44 in place of such a binary voltage.

Furthermore, if such control that the charge storage state of the floating gate 25 and the polarized state of the ferroelectric material film 55 are changed into three or more types is carried out by controlling the amount of stored charge and the polarization, it is possible to weight the fifth signal S5.

Additionally, the input signals may be weighted by making the areas of the lower surfaces of the input electrodes 41, 42, 43 and 44 different from each other.

Although in the above described first and second embodiments, electrons are injected into the floating gate 25, the potential of the channel region 23 may be modulated by injection/extraction of holes into/from the floating gate 25.

Although in the above described embodiment, any Neuro transistor is constructed as one of an N-channel type, a Neuro transistor of a P-channel type can be constructed by changing the conductivity types of the semiconductor substrate 20, the drain region 21 and the source region 22 into opposite conductivity types to those shown in FIGS. 2 and 6.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device for processing a first number of input signals, the first number being equal to at least three, the semiconductor device comprising:

a source region formed in a semiconductor substrate;

a drain region formed in said semiconductor substrate;

a channel region between said source region and said drain region in said semiconductor substrate;

a gate above said channel region, said gate including a second number of input electrodes, the second number being one less than the first number;

a potential modulating film between said channel region and said gate, said potential modulating film being formed of ferromagnetic material and being capable of assuming and holding at least two potential modulating states for modulating the potential of said channel region to different values;

a metal layer provided on a surface of said potential modulating film;

an interlayer insulating film provided between said metal layer and said gate;

state setting means for setting the potential modulating states of said potential modulating film into any one of said at least two potential modulating states based on a predetermined one of said first number of input signals;

input controlling means for supplying to said second number of input electrodes input voltages respectively corresponding to the first number of input signals other than said predetermined one of said first number of input signals; and means for detecting the presence or absence of conduction between said source region and said drain region while the input voltages are supplied to said input electrodes.

2. The semiconductor device according to claim 1, further comprising
   means for changing the potential modulating state of said potential modulating film to a predetermined initial state.

3. The semiconductor device according to claim 1, wherein
   said state setting means controls the polarization of said ferroelectric material film.

4. The semiconductor device according to claim 1, wherein an input signal, corresponding to information which must be held even after power to the semiconductor device is shut off, is assigned to the predetermined one input signal.

5. The semiconductor device according to claim 1, wherein said input controlling means processes said first number of input signals to obtain the input voltages during a predetermined processing cycle, and wherein a signal which is invariably held over the processing cycle is assigned to the predetermined one of the first number of input signals.

6. The semiconductor device according to claim 1, wherein each of the first number of input signals is a binary signal which assumes a first state or a second state, and said input controlling means and said state setting means respectively control the input voltages to said input electrodes and the potential modulating state of said potential modulating film, so that conduction between said source region and said drain region occurs only if all of the first number of input signals assume the first state.

7. A method of operating a semiconductor device in response to a first number of input signals, the first number being equal to at least three, the device including a source region formed in a semiconductor substrate, a drain region formed in the semiconductor substrate, a channel region between the source region and the drain region in the semiconductor substrate, a gate provided above the channel region, the gate including a second number of input electrodes, the second number being one less than the first number, and a potential modulating ferroelectric film provided between the channel region and the gate, wherein the potential modulating film is capable of assuming and holding at least two potential modulating states for modulating the potential of the channel region to different values, the method comprising the steps of:

setting the potential modulating state of the potential modulating film to any one of the at least two states based on a predetermined one of the first number of input signals;

supplying to the first number of input electrodes input voltages respectively corresponding to the first number of input signals other than the predetermined one of the first number of input signals; and detecting the presence or absence of conduction between the source region and the drain region while the input voltages are supplied to the input electrodes;

wherein the semiconductor device further includes a metal layer provided on a surface of the potential modulating film and an interlayer insulating film provided between the metal layer and the gate.

8. The method of operating a semiconductor device according to claim 7, further comprising the step of changing the potential modulating state of the potential modulating film to a predetermined initial state.

9. The method of operating a semiconductor device according to claim 7, wherein said step of setting the potential modulating state of the potential modulating film includes controlling the polarization of the potential modulating film.

10. The method of operating a semiconductor device according to claim 7, further comprising the step of assigning an input signal corresponding to information which must be held even after power to the semiconductor device is shut off, to the predetermined one input signal.

11. The method of operating a semiconductor device according to claim 7, further comprising the step of processing the first number of input signals in a predetermined processing cycle to obtain the input voltages, wherein a signal which is invariably held over the processing cycle is assigned to the predetermined one input signal.

12. The method of operating a semiconductor device according to claim 7, wherein each of the first number of input signals is a binary signal which assumes a first state or a second state, and the input voltages to the second number of input electrodes and the potential modulating state of the potential modulating film are respectively controlled so that conduction between the source region and the drain region occurs only when all of the first number of input signals assume the first state.

* * * * *